(12) United States Patent
Goto et al.

(10) Patent No.: US 10,768,238 B2
(45) Date of Patent: Sep. 8, 2020

(54) INSPECTION METHOD OF ELECTRICAL STORAGE DEVICE AND MANUFACTURING METHOD THEREOF

(71) Applicant: TOYOTA JIDOSHA KABUSHIKI KAISHA, Toyota-shi, Aichi-ken (JP)

(72) Inventors: Takeshi Goto, Kasugai (JP); Kiwamu Kobayashi, Anjo (JP)

(73) Assignee: TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 0 days.

(21) Appl. No.: 16/057,022

(22) Filed: Aug. 7, 2018

(65) Prior Publication Data

US 2019/0056455 A1 Feb. 21, 2019

(30) Foreign Application Priority Data

Aug. 21, 2017 (JP) .................................. 2017-158776
May 30, 2018 (JP) .................................. 2018-103955

(51) Int. Cl.
*G01R 31/389* (2019.01)

(52) U.S. Cl.
CPC .................................. *G01R 31/389* (2019.01)

(58) Field of Classification Search
CPC ...... G01R 3/00; G01R 31/2889; G01R 1/067; G01R 31/2886; G01R 1/0483; G01R 1/06; G01R 31/2851
See application file for complete search history.

(56) References Cited

U.S. PATENT DOCUMENTS

| | | | | |
|---|---|---|---|---|
| 7,532,024 B2 * | 5/2009 | Balog | ................ | G01R 31/2894 324/762.01 |
| 2002/0075030 A1 * | 6/2002 | Schittenhelm | ......... | G01R 31/14 324/750.02 |
| 2009/0015280 A1 * | 1/2009 | Natori | ................ | G01R 31/2891 324/762.05 |

(Continued)

FOREIGN PATENT DOCUMENTS

JP 2010-153275 A 7/2010

OTHER PUBLICATIONS

U.S. Appl. No. 16/013,421, Kiwamu Kobayashi, dated Jun. 20, 2018.

(Continued)

*Primary Examiner* — Giovanni Astacio-Oquendo
(74) *Attorney, Agent, or Firm* — Sughrue Mion, PLLC

(57) ABSTRACT

A circuit is formed by connecting an external power source to a charged electrical storage device so that a polarity of a voltage of the external power source is reverse to a polarity of a voltage of the charged electrical storage device, and the voltage of the external power source is adjusted so that a current does not flow right after the connection. Then, current measurement to acquire a current value after convergence of the current flowing through the circuit due to a voltage drop of the electrical storage device and quality determination based on the current value after convergence are performed. In the current measurement, resistance measurement to actually measure a circuit resistance and prediction to predict a convergence timing of the current based on the actually measured circuit resistance are performed. The current value is acquired when a predicted convergence timing comes.

12 Claims, 10 Drawing Sheets

(56) References Cited

U.S. PATENT DOCUMENTS

2019/0198943 A1    6/2019   Goto et al.

OTHER PUBLICATIONS

U.S. Appl. No. 16/191,679, filed Nov. 15, 2018, Inventors: Takeshi Goto and Kiwamu Kobayashi.
Office Action issued to U.S. Appl. No. 16/191,679 dated Apr. 15, 2020.

* cited by examiner

INSPECTION METHOD OF ELECTRICAL STORAGE DEVICE AND MANUFACTURING METHOD THEREOF

INCORPORATION BY REFERENCE

The disclosure of Japanese Patent Application No. 2018-103955 filed on May 30, 2018 including the specification, drawings and abstract is incorporated herein by reference in its entirety.

BACKGROUND

1. Technical Field

The disclosure relates to an inspection method for determining quality of an electrical storage device. More specifically, the disclosure relates to an inspection method of an electrical storage device, the inspection method being able to quickly perform quality determination based on a discharge current amount, not based on a voltage drop amount of the electrical storage device. The disclosure also relates to a manufacturing method of an electrical storage device, the manufacturing method including the inspection method of the electrical storage device as part of steps.

2. Description of Related Art

Various inspection methods have been proposed as an inspection method for determining quality of an electrical storage device such as a secondary battery. For example, in Japanese Unexamined Patent Application Publication No. 2010-153275 (JP 2010-153275 A), a leaving step of leaving a secondary battery as a determination target to stand in a pressurized state is performed. A battery voltage is measured before and after the leaving step. A difference between the battery voltages measured before and after the leaving step is a voltage drop amount along with the leaving. A battery with a large voltage drop amount has a large self-discharge amount. On this account, it is possible to determine quality of the secondary battery based on the magnitude of the voltage drop amount. Such an inspection method may be performed as one step in a manufacturing method.

SUMMARY

However, the quality determination of the secondary battery has the following possibilities. The quality determination takes time. The reason why the quality determination takes time is that the leaving step should take a long leaving time to obtain a significant voltage drop amount. One reason thereof is that a circuit resistance varies at the time of voltage measurement. On this account, if the voltage drop amount itself is not large to some extent, the influence of variations in circuit resistance cannot be ignored. Further, more strictly, the circuit resistance includes a contact resistance at the time of voltage measurement. The voltage measurement is performed by connecting a measuring instrument between terminals of the secondary battery. At this time, a contact resistance inevitably exists between the terminal on the secondary battery side and a terminal on the measuring instrument side, so that the measurement result is affected by the contact resistance. The contact resistance varies every time the terminal on the secondary battery side is connected to the terminal on the measuring instrument side.

Further, the accuracy of the voltage measurement itself is not so good. This is because the voltage measurement is affected by a voltage drop in an electric current path at the time of measurement by all means. Further, a contact portion between the terminal on the secondary battery side and the terminal on the measuring instrument side varies to some extent every time they are connected to each other, so that a degree of the voltage drop also varies every measurement. In view of this, it is conceivable to improve measurement accuracy such that a measurement time of a self-discharge amount is shortened by uses of current measurement instead of the voltage measurement. This is because the current is uniform at any part in a circuit and therefore the current measurement is barely affected by the contact portion, differently from the voltage measurement. Even so, successful determination may not be achievable just by replacing the voltage measurement with the current measurement.

The disclosure provides an inspection method of an electrical storage device and a manufacturing method of an electrical storage device each of which can perform quality determination of the electrical storage device quickly and highly accurately.

A first aspect of the disclosure relates to an inspection method of an electrical storage device. The inspection method includes: performing current measurement to acquire a current value after convergence of a current flowing through a circuit formed by connecting an external power source to a charged electrical storage device so that a polarity of a voltage of the external power source is reverse to a polarity of a voltage of the charged electrical storage device, the current measurement being performed after the voltage of the external power source is adjusted so that the current does not flow through the circuit right after the connection; and performing quality determination to determine quality of the electrical storage device based on the current value after convergence of the current, the current value being acquired by the current measurement. A relationship between a circuit resistance of the circuit and a necessary time for convergence of the current in the current measurement is grasped in advance. Resistance measurement to actually measure a circuit resistance of the circuit and prediction to predict a convergence timing of the current based on the actually measured circuit resistance and the relationship are performed. In the current measurement, the current value is acquired when the predicted convergence timing comes, and the acquired current value is set as the current value after convergence.

In the inspection method of the first aspect, quality inspection on a self-discharge property of the electrical storage device is performed. Accordingly, the circuit is formed by the charged electrical storage device and the external power source and the voltage of the external power source is adjusted so that a current does not flow through the circuit. After that, along with a decrease of the voltage of the electrical storage device due to self-discharge, a current flows through the circuit and the current increases. A magnitude of a current value after the increase converges is an index indicative of a magnitude of the self-discharge property. On this account, it is possible to determine the quality of the electrical storage device based on the current value after convergence. Hereby, the inspection method of the first aspect is more advantageous than inspection by measuring a voltage drop of the electrical storage device, in terms of a necessary processing time and measurement accuracy.

Here, in the first aspect, a convergence timing of a current of a circuit is predicted per electrical storage device, and a current value at the time when the predicted convergence timing comes is set as the acquired current value after convergence. This is because the convergence timing depends on a circuit resistance of the circuit and the circuit resistance varies depending on the circuits. In view of this, in the first aspect, a circuit resistance is actually measured and compared with the relationship between the circuit resistance and the convergence timing, grasped in advance, so that a convergence timing is predicted. This makes it possible to prevent false determination based on a current value obtained at an earlier timing. Further, it is possible to prevent the current measurement from taking an excessively long time.

In the inspection method of the first aspect, the resistance measurement may be performed after the electrical storage device is connected to the external power source, and the current measurement may be then performed without disconnecting the electrical storage device from the external power source in the circuit.

In the inspection method of the first aspect, in the current measurement, the resistance measurement and the prediction are performed, and after that, the electrical storage device is not disconnected from the external power source in the circuit. One reason why the circuit resistance varies depending on the circuits is that a contact resistance due to the connection between the electrical storage device and the external power source varies inevitably. In the first aspect, the resistance measurement is performed in a state where the contact resistance is included. Because of this, the determination accuracy is higher.

In the inspection method of the first aspect, the resistance measurement may be performed such that: the external power source and a first terminal of the electrical storage device are connected by a first probe and a first sub-probe parallel to each other, and a circuit resistance of a first closed circuit constituted by the first probe and the first sub-probe thus parallel to each other is acquired; the external power source and a second terminal of the electrical storage device are connected by a second probe and a second sub-probe parallel to each other, and a circuit resistance of a second closed circuit constituted by the second probe and the second sub-probe thus parallel to each other is acquired; and a half of a total sum of the acquired circuit resistance of the first closed circuit and the acquired circuit resistance of the second closed circuit is set as the circuit resistance of the circuit. With such a configuration, the circuit resistance is measured appropriately in a state where the circuit resistance includes the contact resistance between the electrical storage device and the external power source, so that the convergence timing can be predicted with high accuracy.

In the inspection method of the first aspect, the current measurement may be performed such that: the resistance measurement and the prediction performed subsequently to the resistance measurement are performed repeatedly so that the predicted convergence timing is updated; and the current value is acquired when a latest predicted convergence timing comes. The convergence timing is also affected by other factors such as the temperature of the electrical storage device, in addition to the circuit resistance. On this account, when the prediction of the convergence timing is performed several times, it is also possible to deal with the influence on the convergence timing by a change of the state after the current measurement is started. This further improves the determination accuracy.

In the inspection method of the first aspect, determination on whether the current flowing through the circuit converges or not may be performed such that, when a change of the current value of the current flowing through the circuit becomes smaller than a reference set in advance, it is determined that the current converges.

In the inspection method of the first aspect, the quality determination to determine the quality of the electrical storage device may be performed by comparing the current value after convergence of the current flowing through the circuit with a reference value.

A second aspect of the disclosure relates to a manufacturing method of an electrical storage device. The manufacturing method includes: performing initial charge such that an assembled electrical storage device in an uncharged state is charged initially to a predetermined charged state, so that a charged electrical storage device is formed; and performing inspection to inspect the charged electrical storage device. The inspection is performed by performing the inspection method of the first aspect.

With the configuration, an inspection method of an electrical storage device and a manufacturing method of an electrical storage device each of which can perform quality determination of the electrical storage device quickly and highly accurately are provided.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Figure 1:
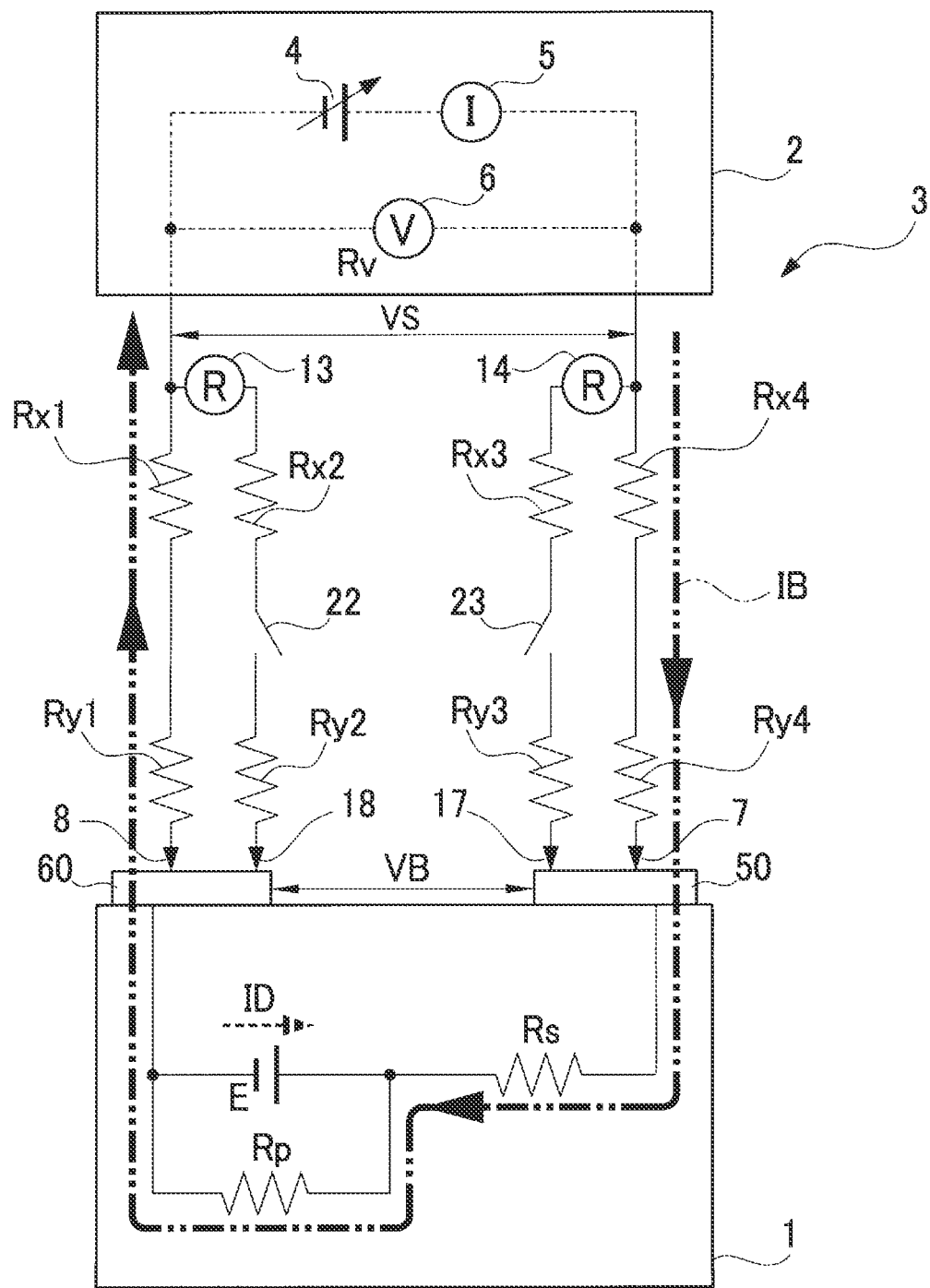
FIG. 1 is a circuit diagram illustrating a configuration of a circuit formed in order to perform an inspection method of a secondary battery in an embodiment.

The following describes an embodiment for embodying the disclosure in detail with reference to the attached drawings. As illustrated in FIG. 1, an inspection method of an electrical storage device in the present embodiment is performed in such a state that a circuit 3 is formed by connecting a measuring device 2 to a secondary battery 1 that is an electrical storage device as an inspection target. First described is a basic principle of the inspection method of the secondary battery 1 by the measuring device 2.

Basic Principle

Figure 2:
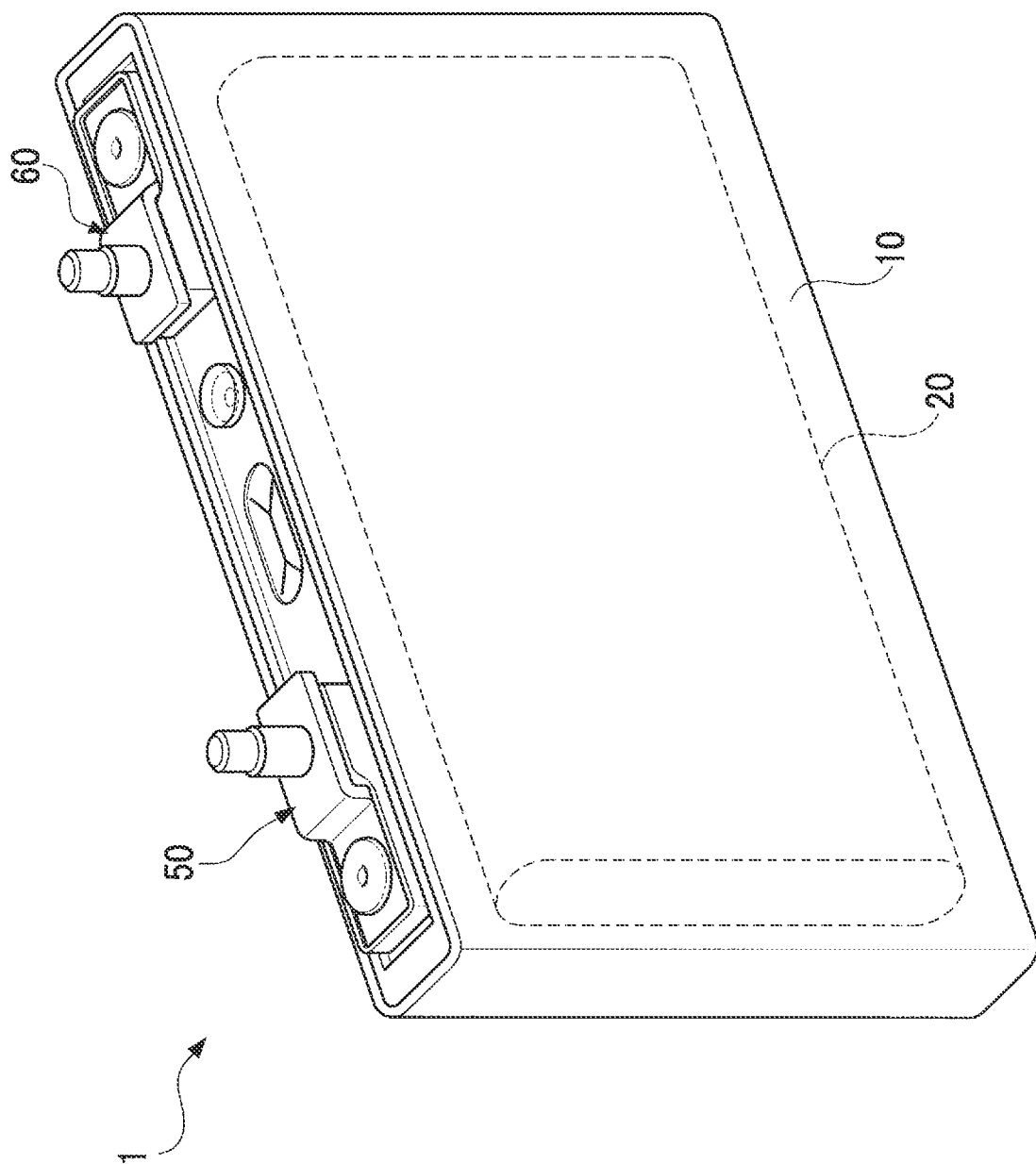
FIG. 2 is an outside drawing illustrating an example of the secondary battery as an inspection target in the embodiment.

The secondary battery 1 is schematically illustrated in FIG. 1, but actually has a flat-square-shaped external appearance as illustrated in FIG. 2, for example. The secondary battery 1 in FIG. 2 is configured such that an electrode laminated body 20 is provided inside an outer packaging body 10. The electrode laminated body 20 is configured such that a positive plate and a negative plate are laminated via a separator. An electrolytic solution is also accommodated inside the outer packaging body 10 as well as the electrode laminated body 20. Further, positive and negative terminals 50, 60 are provided on an external surface of the secondary battery 1. Note that the secondary battery 1 is not limited to the one with a flat-square shape as illustrated in FIG. 2 and may be one with other shapes such as a cylindrical shape.

FIG. 1 will be further described. In FIG. 1, the secondary battery 1 is illustrated schematically. The secondary battery 1 in FIG. 1 is expressed as a model constituted by an electromotive element E, an internal resistance Rs, and a short circuit resistance Rp. The internal resistance Rs is placed in series with the electromotive element E. The short circuit resistance Rp is a model of a conductive path to be formed by very small foreign metallic particles that might enter the electrode laminated body 20, and the short circuit resistance Rp is placed in parallel with the electromotive element E.

Further, the measuring device 2 includes a direct-current power source 4, an ammeter 5, a voltmeter 6, and probes 7, 8. The ammeter 5 is placed in series with the direct-current power source 4, and the voltmeter 6 is placed in parallel with the direct-current power source 4. An output voltage VS of the direct-current power source 4 is variable. The direct-current power source 4 is used to apply the output voltage VS to the secondary battery 1 as will be described later. The ammeter 5 measures a current flowing through the circuit 3. The voltmeter 6 measures a voltage between the probes 7, 8. In FIG. 1, the probes 7, 8 of the measuring device 2 are connected to the terminals 50, 60 of the secondary battery 1, so that the circuit 3 is formed.

Further, in the circuit 3 in the present embodiment, sub-probes 17, 18 are provided in parallel with the probe 7 and the probe 8 in the measuring device 2, respectively. An ohmmeter 13 and a switch 22 are provided on a lead-wire from the measuring device 2 to the sub-probe 18, and an ohmmeter 14 and a switch 23 are provided on a lead-wire from the measuring device 2 to the sub-probe 17. In FIG. 1, the ohmmeters 13, 14 are illustrated outside the measuring device 2, but the ohmmeters 13, 14 may be provided inside the measuring device 2. Here, in FIG. 1, Rx1 indicates a lead-wire resistance from the measuring device 2 to the probe 8, Rx2 indicates a lead-wire resistance from the measuring device 2 to the sub-probe 18, Rx3 indicates a lead-wire resistance from the measuring device 2 to the sub-probe 17, and Rx4 indicates a lead-wire resistance from the measuring device 2 to the probe 7. Further, Ry1 indicates a contact resistance between the probe 8 and the terminal 60, Ry2 indicates a contact resistance between the sub-probe 18 and the terminal 60, Ry3 indicates a contact resistance between the sub-probe 17 and the terminal 50, and Ry4 indicates a contact resistance between the probe 7 and the terminal 50. Here, in the circuit 3 in the present embodiment, the following two expressions are established.

$$Rx1=Rx2$$

$$Rx3=Rx4$$

Further, the probe 7 and the sub-probe 17 are configured such that their respective contact resistances Ry4, Ry3 are generally equal to each other. Similarly, the probe 8 and the sub-probe 18 are configured such that their respective contact resistances Ry1, Ry2 are generally equal to each other. Further, the contact resistances of the switches 22, 23 in an ON state shall be small in comparison with the contact resistances Ry1 to Ry4 to such an extent that they can be ignored.

In the inspection method by the measuring device 2, the magnitude of the self-discharge amount of the secondary battery 1 is inspected. When the self-discharge amount is large, the secondary battery 1 is defective, and when the self-discharge amount is small, the secondary battery 1 is non-defective. For this purpose, the secondary battery 1 is charged before it is connected to the circuit 3. The secondary battery 1 thus charged is connected to the circuit 3 and the self-discharge amount of the secondary battery 1 is calculated by the measuring device 2 in that state. Based on the calculation result, the quality of the secondary battery 1 is determined.

More specifically, the charged secondary battery 1 is connected to the circuit 3. At this time, the charged secondary battery 1 to be connected to the circuit 3 is in a state where high-temperature aging that is generally performed after charging is also finished and a battery voltage is stabilized. Note that the inspection itself in the present embodiment is performed at room temperature. After the secondary battery 1 is connected to the circuit 3, the output voltage VS of the measuring device 2 is adjusted first so that a reading value of the ammeter 5 is zero. The output voltage VS at this time is the same as an initial battery voltage VB1 that is an initial value of a battery voltage VB of the secondary battery 1.

In this state, the output voltage VS is equal to the initial battery voltage VB1, and a polarity of the output voltage VS and a polarity of the battery voltage VB of the secondary battery 1 are reverse to each other. On this account, those voltages are offset, so that a circuit current IB of the circuit 3 is zero. Then, the output voltage VS of the measuring device 2 is maintained to be constant at the initial battery voltage VB1 and is left to stand.

Figure 3:
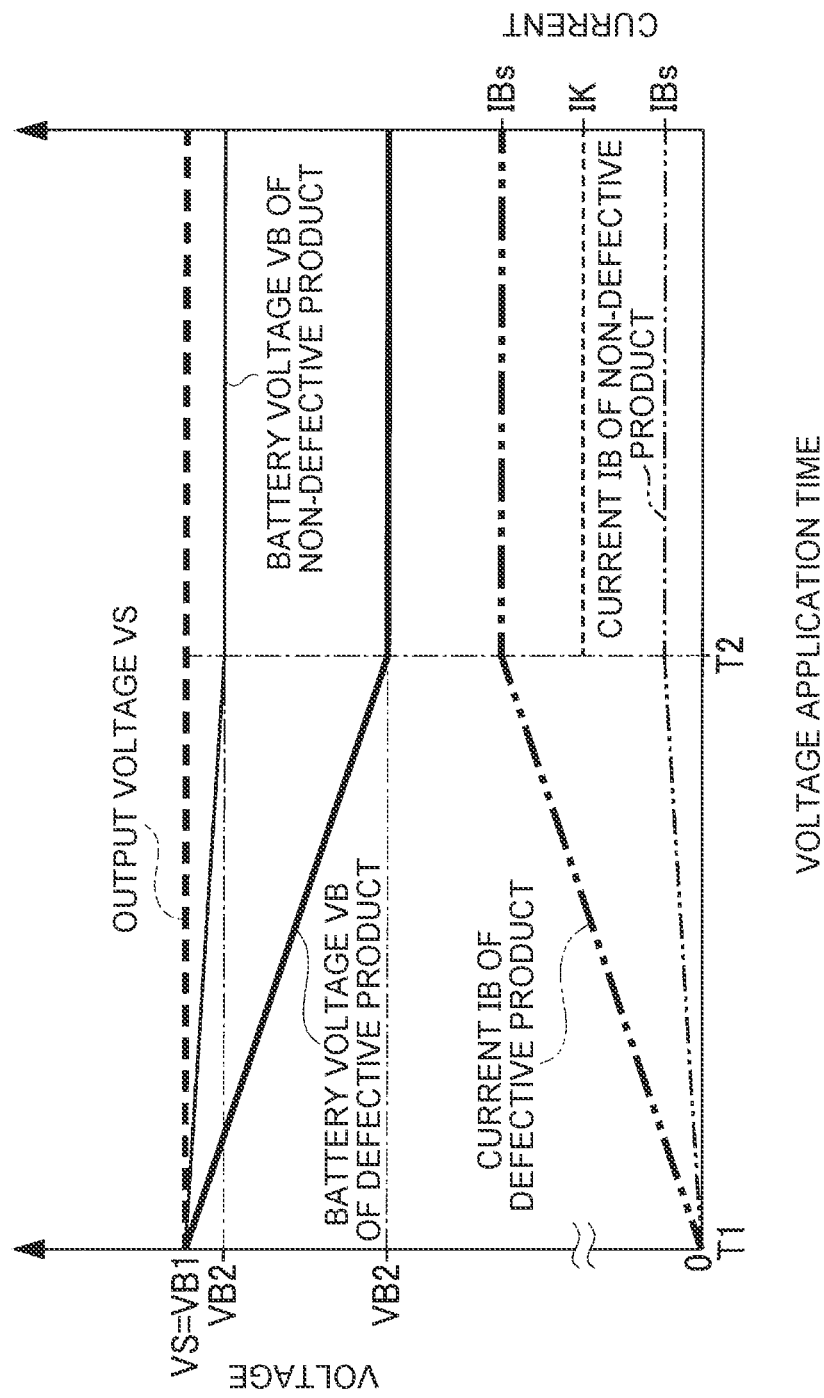
FIG. 3 is a graph illustrating changes of a voltage and a current with time in the inspection of the embodiment.

A subsequent state of the circuit 3 is illustrated in FIG. 3. In FIG. 3, the horizontal axis indicates time, the vertical axis on the left side indicates voltage, and the vertical axis on the right side indicates current. In terms of the time on the horizontal axis, time T1 at the left end in FIG. 3 indicates a timing at which application of the output voltage VS equal to the initial battery voltage VB1 is started as described above. After time T1, the battery voltage VB gradually decreases from the initial battery voltage VB1 due to self-discharge of the secondary battery 1. As a result, the balance between the output voltage VS and the battery voltage VB is lost, so that the circuit current IB flows through the circuit 3. The circuit current IB gradually increases from zero. The circuit current IB is directly measured by the ammeter 5. When time T2 comes after time T1, the decrease of the battery voltage VB and the increase of the circuit current IB are both saturated, so that the battery voltage VB and the circuit current IB both become constant (VB2, IBs) afterward.

Note that, as apparent from FIG. 3, in comparison with a non-defective secondary battery 1, in a defective secondary battery 1, the increase of the circuit current IB and the decrease of the battery voltage VB are both steep. Accordingly, a circuit current IBs after convergence in the defective secondary battery 1 is larger than a circuit current IBs after convergence in the non-defective secondary battery 1. Further, a battery voltage VB2 after convergence in the defective secondary battery 1 is lower than a battery voltage VB2 after convergence in the non-defective secondary battery 1.

The reason why the state of the circuit 3 after time T1 becomes the state in FIG. 3 will be described. First, the battery voltage VB decreases because of self-discharge of the secondary battery 1 as described above. Due to the self-discharge, a self-discharge current ID flows through the electromotive element E of the secondary battery 1. When the self-discharge amount of the secondary battery 1 is large, the self-discharge current ID is large, and when the self-discharge amount is small, the self-discharge current ID is small. In the secondary battery 1 in which the value of the short circuit resistance Rp is small, the self-discharge current ID tends to be large.

In the meantime, the circuit current IB flowing due to the decrease of the battery voltage VB after time T1 is a current in a direction to charge the secondary battery 1. That is, the circuit current IB works in a direction to restrain self-discharge of the secondary battery 1, and inside the secondary battery 1, a polarity of the circuit current IB is reverse to a polarity of the self-discharge current ID. When the circuit current IB increases and reaches the same magnitude as the self-discharge current ID, the self-discharge stops substantially. This happens at time T2. Hereby, after time T2, the battery voltage VB and the circuit current IB are both constant (VB2, IBs). Note that whether the circuit current IB has converged or not should be determined by a known technique. For example, the value of the circuit current IB is sampled at suitable frequencies, and when a change of the value is smaller than a reference set in advance, it is determined that the circuit current IB converges.

Here, as described above, the circuit current IB can be directly grasped as the reading value of the ammeter 5. In view of this, when a reference value IK is set with respect to the circuit current IBs after convergence, quality determination of the secondary battery 1 can be performed. When the circuit current IBs after convergence is larger than the reference value IK, the secondary battery 1 is defective with a large self-discharge amount. In the meantime, when the circuit current IBs is smaller than the reference value IK, the secondary battery 1 is a non-defective product with a low self-discharge amount.

A necessary processing time (time T1→time T2) in such a determination method is shorter than the leaving time in the technique described in Description of Related Art. Further, in FIG. 3, the output voltage VS is maintained to be constant at the initial battery voltage VB1, but the necessary processing time can be further shortened by gradually increasing the output voltage VS from the initial battery voltage VB1 after time T1. Note that quality determination based on the battery voltage VB2 after convergence in FIG. 3 is not so preferable means. This is because the battery voltage VB does not necessarily appear accurately as the reading value of the voltmeter 6. This is the basic principle of the inspection method of the secondary battery 1 by the measuring device 2.

Feature Point as Present Embodiment

In the description made so far, time T2 has been described as it is well known. However, in practice, even if the secondary batteries 1 have the same specification, time T2 varies depending on the secondary batteries 1. As a result of the study of the inventors, it was found that a main factor of the variation is a circuit resistance of the circuit 3 formed as illustrated in FIG. 1. The circuit resistance as used herein indicates a resistance on the measuring device 2 constituting the circuit 3. The resistance on the measuring device 2 side indicates the lead-wire resistances Rx1, Rx4 and the contact resistances Ry1, Ry4. That is, when the circuit resistance is indicated by Rc, Rc can be expressed as the following expression:

$$Rc = Rx1 + Ry1 + Rx4 + Ry4$$

Figure 4:
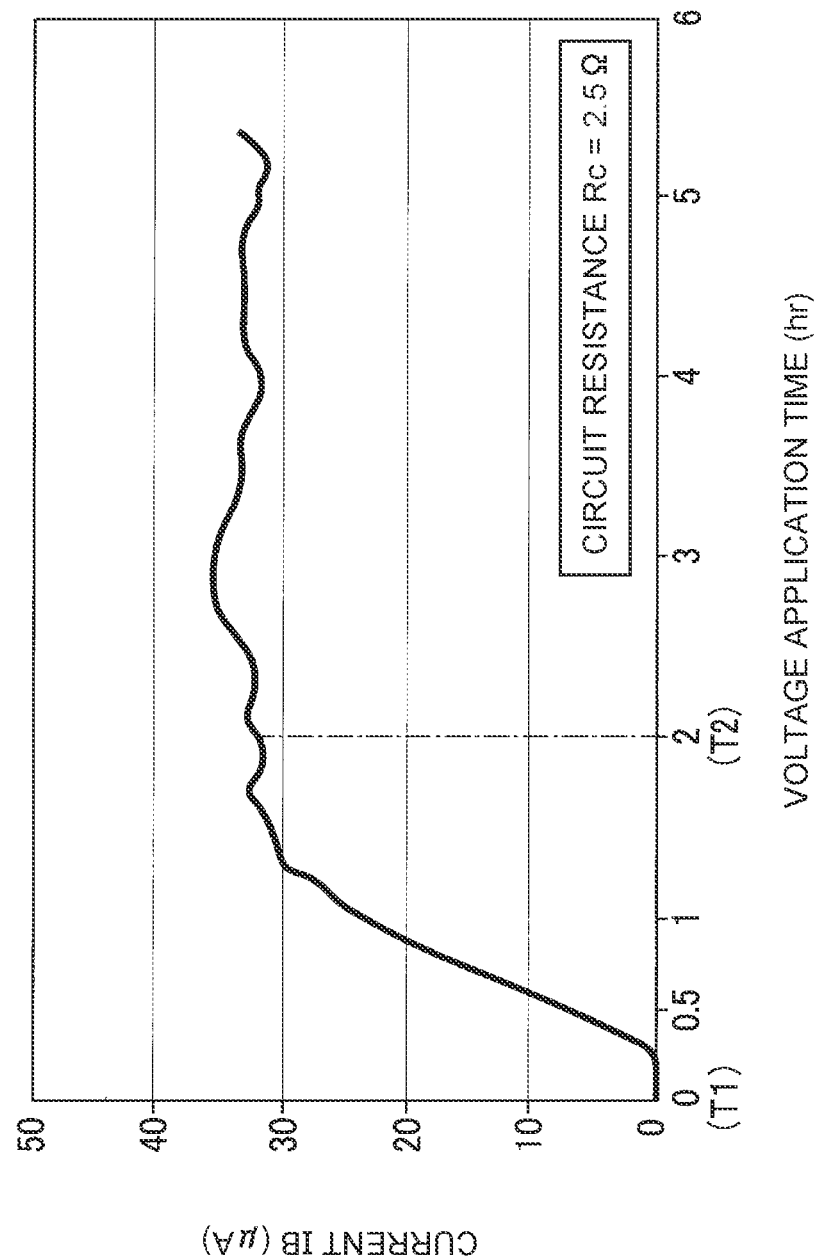
FIG. 4 is a graph illustrating an example (in the case of a low resistance) of change of a measured circuit current with time.

Here, the circuit resistance may include the contact resistances Ry4, Ry1 of the probes 7, 8, as has been described in the foregoing. The contact resistances Ry4, Ry1 change every time the probes 7, 8 are connected to the terminals 50, 60. Further, when a plurality of circuits 3 as illustrated in FIG. 1 is formed, the circuits 3 have different values as the contact resistances Ry1, Ry4. Because of this, the circuit resistance Rc varies and time T2 varies. More specifically, a necessary time (time T2−time T1) for convergence of the circuit current IB is longer in the case where the circuit resistance Rc is large (FIG. 5) than in the case where the circuit resistance Rc is small (FIG. 4). This is because, at a high resistance, a voltage drop due to the contact resistance is large, and therefore, a component, of the output voltage VS of the direct-current power source 4, that effectively contributes to the charge of the electromotive element E is small by just that much.

In view of this, in the present embodiment, respective circuit resistances Rc of the circuits 3 are actually measured. Time T2 is predicted based on an actual value of the circuit resistance Rc. In order to measure the actual value of the circuit resistance Rc, the sub-probes 17, 18 in FIG. 1 are used. That is, in the present embodiment, both the probe 7 and the sub-probe 17 are connected to the terminal 50. Similarly, both the probe 8 and the sub-probe 18 are connected to the terminal 60. Here, as described above, in order to have the same contact resistance, the probe 7 and the sub-probe 17 are pressed against the terminal 50 with the same pressing force. Similarly, the probe 8 and the sub-probe 18 are also pressed against the terminal 60 with the same pressing force. Note that the switches 22, 23 are turned off if not needed particularly.

The actual measurement of the circuit resistance Rc in the circuit 3 in FIG. 1 is performed as follows. When the actual measurement of the circuit resistance Rc is performed, the switches 22, 23 are turned on, so that resistance measurement is performed by the ohmmeters 13, 14. When the resistance measurement is performed as such, a measurement target of the ohmmeter 13 is a closed circuit constituted only by the lead-wire resistances Rx1, Rx2 and the contact resistances Ry1, Ry2. Similarly, a measurement target of the ohmmeter 14 is a closed circuit constituted only by the lead-wire resistances Rx3, Rx4 and the contact resistances Ry3, Ry4.

Here, the following relationship is established due to the relationships of the lead-wire resistances Rx1 to Rx4 and the contact resistances Ry1 to Ry4. That is, respective total sums of a lead-wire resistance and a contact resistance in two probes that make contact with the same terminal are equal to each other.

$$Rx1 + Ry1 = Rx2 + Ry2$$

$$Rx3 + Ry3 = Rx4 + Ry4$$

Hereby, a total sum (Rx4+Ry4) of the lead-wire resistance and the contact resistance of the probe 7 is found as a half of a measured value of the ohmmeter 14. Similarly, a total sum (Rx1+Ry1) of the lead-wire resistance and the contact resistance of the probe 8 is found as a half of a measured value of the ohmmeter 13. Hereby, the circuit resistance Rc is calculated as a half of a total sum of the measured values of the ohmmeters 13, 14. Note that it is unnecessary to calculate the lead-wire resistances Rx1, Rx2 and the contact resistances Ry1, Ry2, individually.

Note that, after the circuit resistance Rc is measured as described above, the connection states of the probes 7, 8 and the sub-probes 17, 18 with respect to the terminals 50, 60 are not changed until current measurement in FIG. 3 is completed. The reason is as follows: when the probes 7, 8 and the sub-probes 17, 18 are once disconnected from the terminals 50, 60 and then are connected thereto again, their contact resistances are changed, so that the actual measurement of the circuit resistance Rc becomes in vain. Further, the switches 22, 23 are turned off again.

Figure 5:
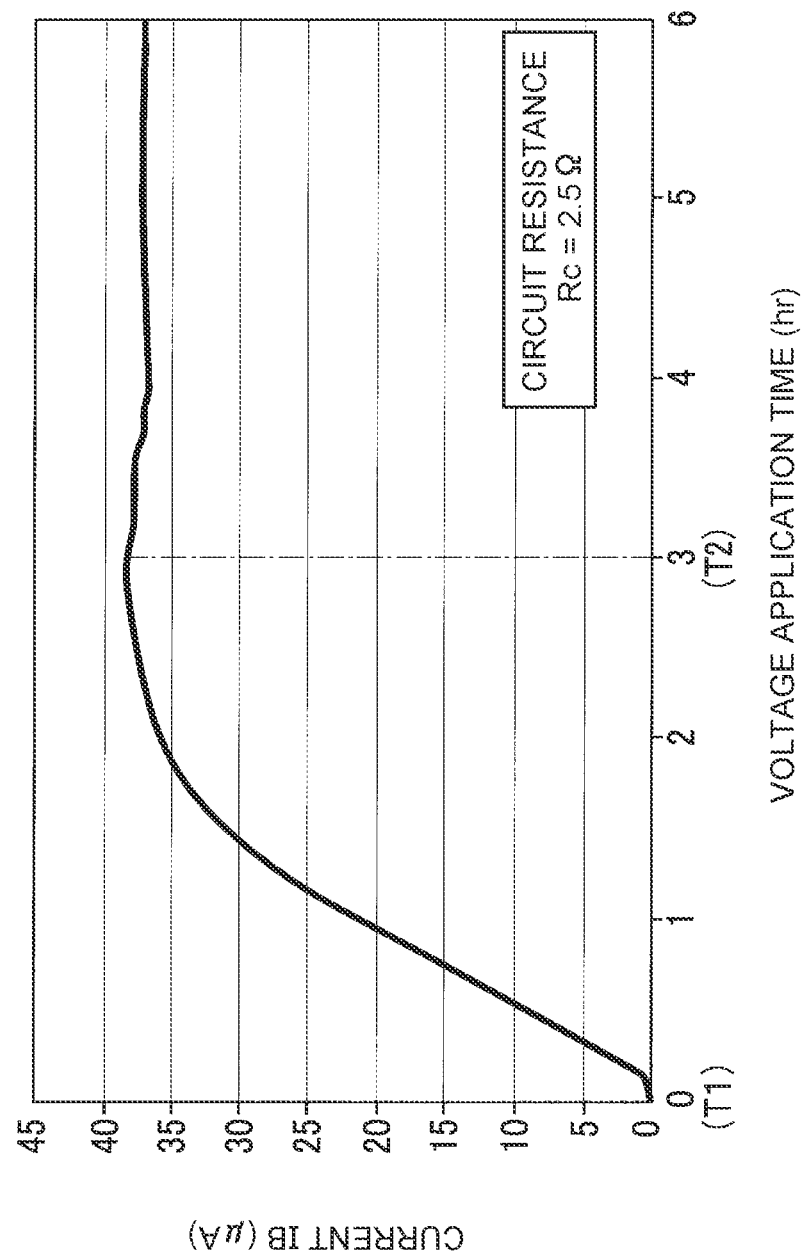
FIG. 5 is a graph illustrating an example (in the case of a high resistance) of change of a measured circuit current with time.
Figure 6:
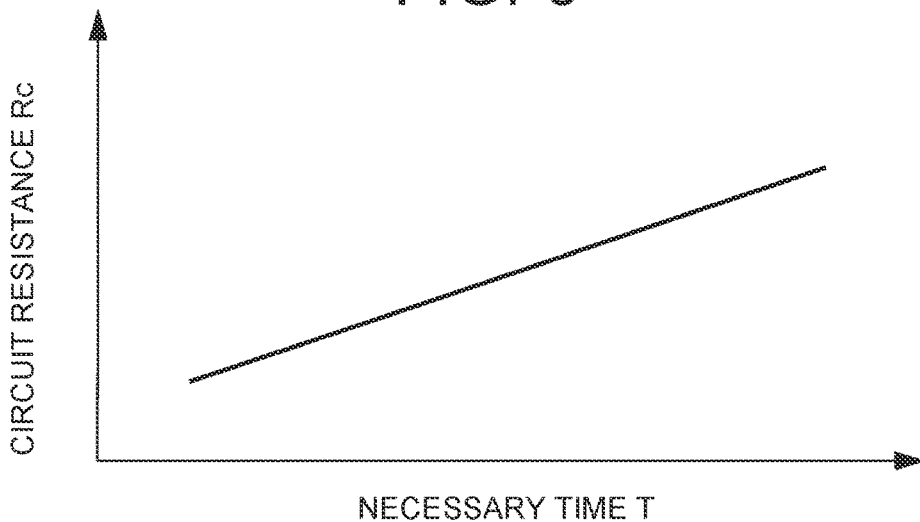
FIG. 6 is a graph illustrating a relationship between a circuit resistance and a necessary time for convergence of a circuit current.

In the inspection method of the present embodiment, a relationship between the circuit resistance Rc and the necessary time T (time T2−time T1) for convergence of the circuit current IB is grasped in advance. As described above, the circuit resistance Rc and the necessary time T have a positive correlation as has been described in the foregoing (FIGS. 4, 5). Accordingly, the positive correlation can be expressed as a graph inclined upward toward the right side as illustrated in FIG. 6. By performing examination by use of many non-defective secondary batteries 1 with the same specification, the graph in FIG. 6 can be formed. When the graph of FIG. 6 is formed in advance, a necessary time T of a given secondary battery 1 can be found by putting its actually measured circuit resistance Rc in the graph. Hereby, time T2 can be predicted.

When time T2 can be predicted as such before time T2 comes, the following advantage can be obtained. That is, the circuit current IB acquired at an appropriate timing can be considered as the circuit current IBs after convergence. If a circuit current IB acquired before time T2 comes is considered as the circuit current IBs after convergence, its value is smaller than a proper circuit current IBs after convergence. If quality determination is performed on the secondary battery 1 with such a circuit current value, the secondary battery 1 that should be determined as a defective product may be mistakenly determined as a non-defective product. In the meantime, if a circuit current IBs is acquired after a considerable time has passed from time T2, a time longer than necessary is spent for quality determination, although this does not cause false determination. This does not increase production efficiency. In the present embodiment, time T2 is predicted appropriately, so that such adverse effects are removed.

Note that the prediction of time T2 may be performed once or several times. The reason is that the circuit resistance Rc may fluctuate. The circuit resistance Rc does not largely fluctuate, but the circuit resistance Rc may fluctuate due to temperature fluctuation. When the temperature of the secondary battery 1 fluctuates, the internal resistance Rs also fluctuates, so that the circuit resistance Rc fluctuates. Accordingly, it is preferable that the prediction of time T2 be performed again at an appropriate timing and a predicted value be overwritten. Further, in a case where the probe 7, 8 is disconnected from the terminal 50, 60 unintentionally and the probe 7, 8 should be reconnected to the terminal 50, 60, it is preferable to predict time T2 again. This is because the contact resistance has changed so that the circuit resistance Rc should have changed by just that much.

For example, there is such a technique that a time interval for the prediction of time T2 is set to a suitable constant value (example, 30 minutes, and the like) in advance. Alternatively, when time T2 is predicted, a next prediction timing may be set. In this case, for example, such a technique is conceivable that, when a predetermined ratio of a remaining time from execution of the prediction to time T2 has passed, time T2 is predicted again. That is, when the "predetermined ratio" is set to an appropriate value within a range from around 50% to 80%, setting of a next prediction timing can be also performed at the time when the prediction is performed. However, in a case where such a technique is employed, as a remaining time to time T2 becomes shorter, the prediction is performed more frequently. On this account, the following measures may be taken, e.g., a minimum time may be set to an interval to the next prediction timing or an upper limit may be provided to the number of times of execution of prediction.

Further, in terms of updating of time T2 at the time when the prediction is performed the second time or later, there is also a technique other than the overwriting of time T2 by newly predicted time T2 itself. For example, there is such a technique that a representative value (an average or the like) of newly predicted time T2 and previous time T2 is calculated, and time T2 is overwritten with the representative value. Further, a timing when the first prediction is performed may be determined in advance.

In the meantime, the temperature of the secondary battery 1 may be maintained to be constant so that the fluctuation of the circuit resistance Rc is restrained. For example, the whole circuit 3 in FIG. 1 is put in a thermostatic chamber, and when the temperature of the secondary battery 1 becomes constant, the actual measurement of the circuit resistance Rc is performed and the circuit current IB is acquired subsequently. With such a configuration, the number of times of prediction of time T2 can be set to just one. Note that this also includes a case where the measurement is performed in the thermostatic chamber and time T2 is predicted several times.

Flow of Inspection

Figure 7:
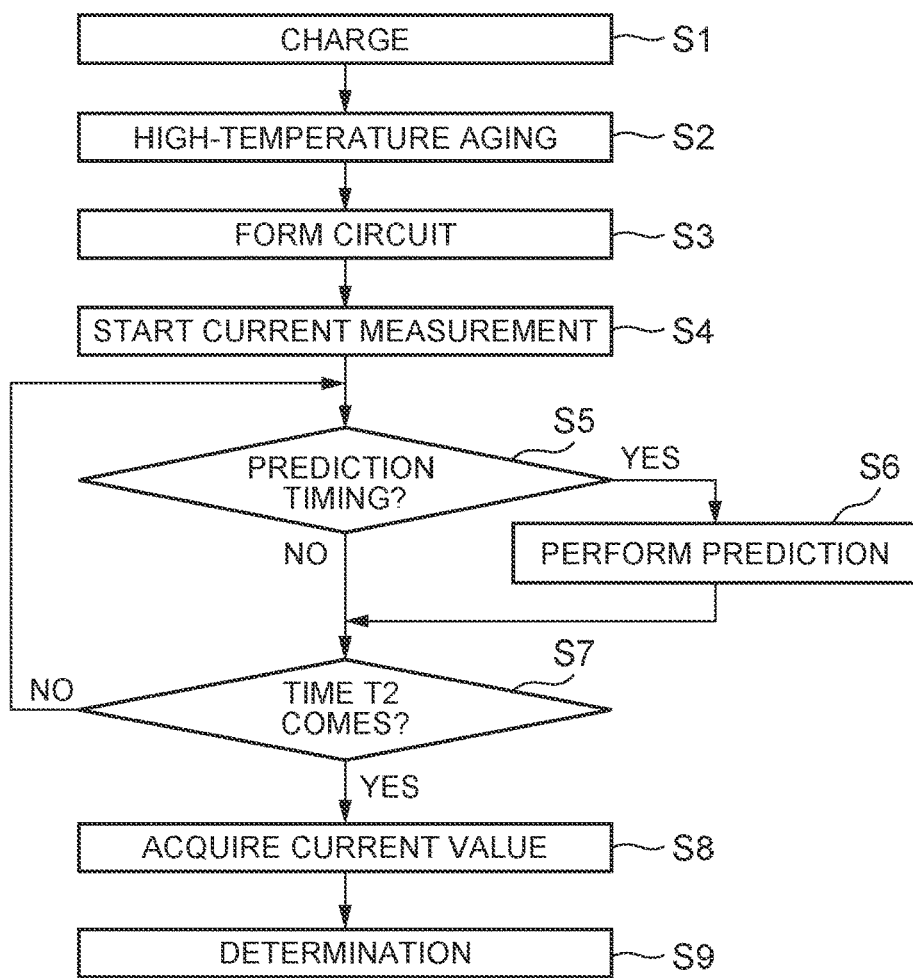
FIG. 7 is a flowchart illustrating a procedure of the inspection method of the secondary battery in the embodiment.

The flow of quality inspection by the above method will be described with reference to FIG. 7. First, the secondary batteries 1 as targets are charged (S1). This charge should be performed so that respective battery voltages VB of the secondary batteries 1 reach a target value. After that, high-temperature aging is performed (S2). Note that the high-temperature aging is a process performed generally, but is not essential. Subsequently, the circuit 3 as illustrated in FIG.1 is formed (S3). At this time, the probes 7, 8 are connected to the terminals 50, 60, respectively. Then, the current measurement in FIG. 3 is started (S4).

When a set prediction timing comes (S5: Yes), prediction of time T2 is performed as described above (S6). Hereby, time T2 is set. Further, in a case where the prediction of time T2 is set to be performed several times, a next prediction timing is set at this time. Note that, in FIG. 7, the first prediction timing is set after the current measurement is started (e.g., in ten minutes). Alternatively, the first prediction may be set to be performed after the circuit 3 is formed (S3) but before the current measurement is started (S4). When the prediction timing comes again before time T2 thus set (S7: No S5: Yes), the prediction of time T2 is performed again (S6).

When time T2 thus set comes (S7: Yes), a circuit current IB at the point is acquired (S8). The acquired circuit current IB is considered as a circuit current IBs after convergence. Then, quality determination of the secondary battery 1 is performed based on the circuit current IBs (S9). This is the flow of the inspection according to the procedure of FIG. 7.

Modification of Resistance Measurement

Here, modifications of the actual measurement method of the circuit resistance Rc will be described. In the following modifications, the switches 22, 23 and the sub-probes 17, 18 in the configuration illustrated in the circuit diagram of FIG. 1 are not used. Accordingly, the lead-wire resistances Rx2, Rx3 and the contact resistances Ry2, Ry3 are not taken into consideration.

Figure 8:
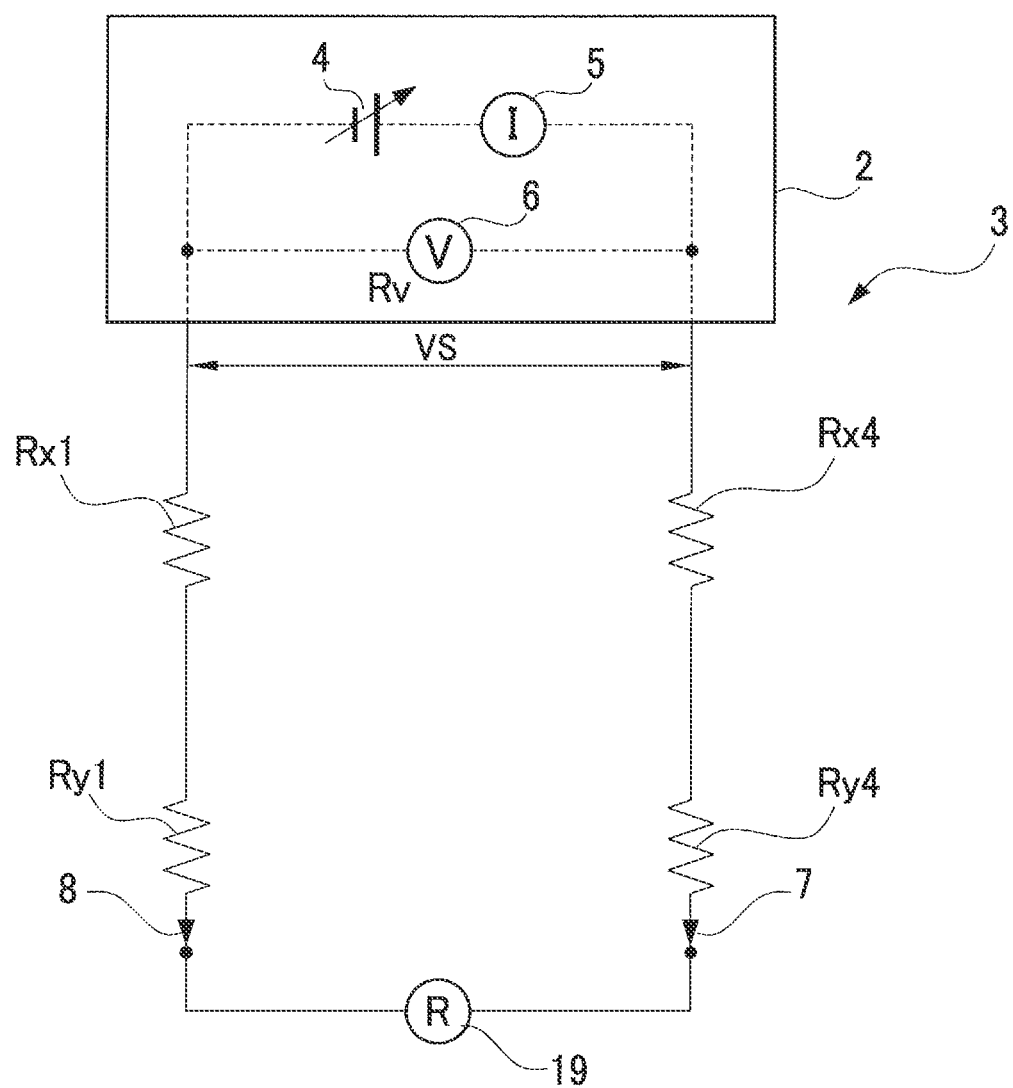
FIG. 8 is a circuit diagram illustrating a first modification of actual measurement of the circuit resistance.

A first modification is illustrated in FIG. 8. In the modification of FIG. 8, an ohmmeter 19 is connected between the probes 7, 8 so as to measure the circuit resistance Rc. The measurement of the circuit resistance Rc in this modification is performed before the probes 7, 8 are connected to the secondary battery 1. At the time of the measurement, the output voltage VS of the direct-current power source 4 is turned off. In the modification, the ohmmeters 13, 14 and the sub-probes 17, 18 in FIG. 1 are not used.

Figure 9:
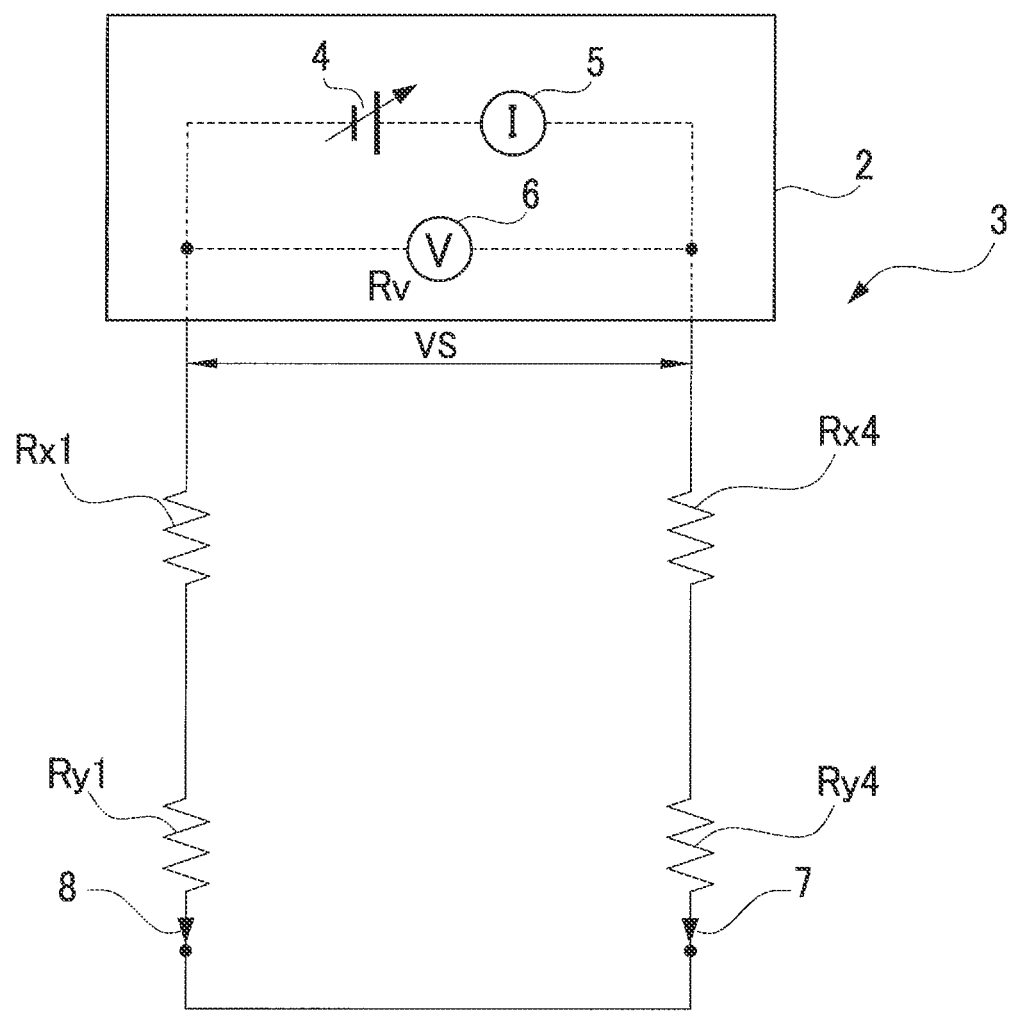
FIG. 9 is a circuit diagram illustrating a second modification of actual measurement of the circuit resistance.

A second modification is illustrated in FIG. 9. In the modification of FIG. 9, the circuit resistance Rc is measured by short-circuiting the probes 7, 8. In this modification, the measurement of the circuit resistance Rc is also performed before the probes 7, 8 are connected to the secondary battery 1. At the time of the measurement, the output voltage VS of the direct-current power source 4 is set to a very low value, so that a weak circuit current IB flows through the circuit 3. The circuit resistance Rc is calculated by a ratio between the output voltage VS and the circuit current IB. In this modification, the ohmmeters 13, 14 and the sub-probes 17, 18 are also not used.

Figure 10:
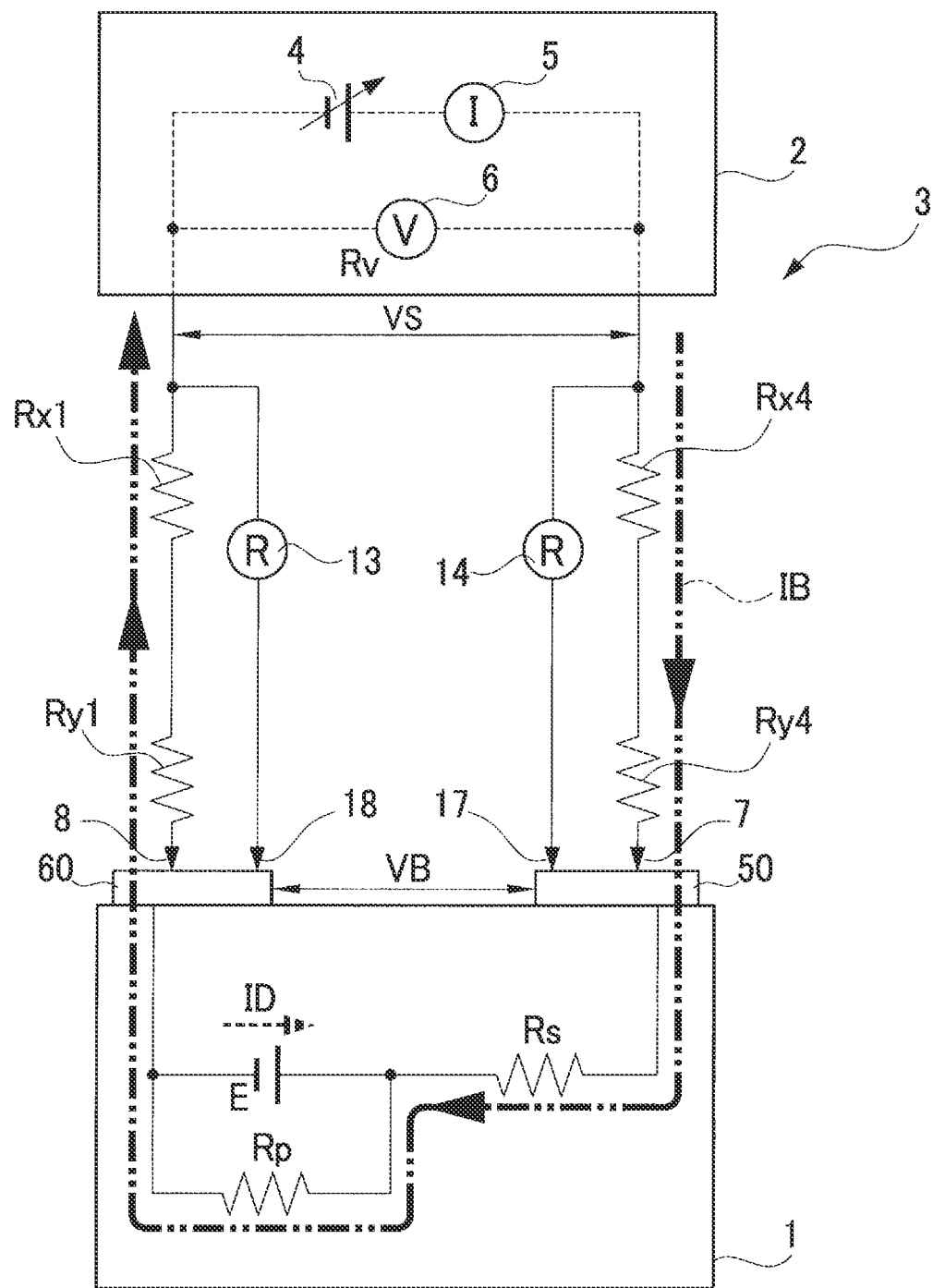
FIG. 10 is a circuit diagram illustrating a third modification of actual measurement of the circuit resistance.

A third modification is illustrated in FIG. 10. In the modification of FIG. 10, respective circuit resistances (Rx4+Ry4, Rx1+Ry1) of the probes 7, 8 are directly measured by use of the ohmmeters 14, 13. In the modification, the circuit resistance Rc is measured such that the probes 7, 8 and the sub-probes 17, 18 are connected to the secondary battery 1. A total sum of the reading values of the ohmmeters 13, 14 is the circuit resistance Rc. The measurement of the circuit current IB as inspection of a self-discharge amount is performed such that the sub-probes 17, 18 are disconnected from the terminals 50, 60 (or the switches 22, 23 are turned off) after the measurement of the circuit resistance Rc.

Figure 11:
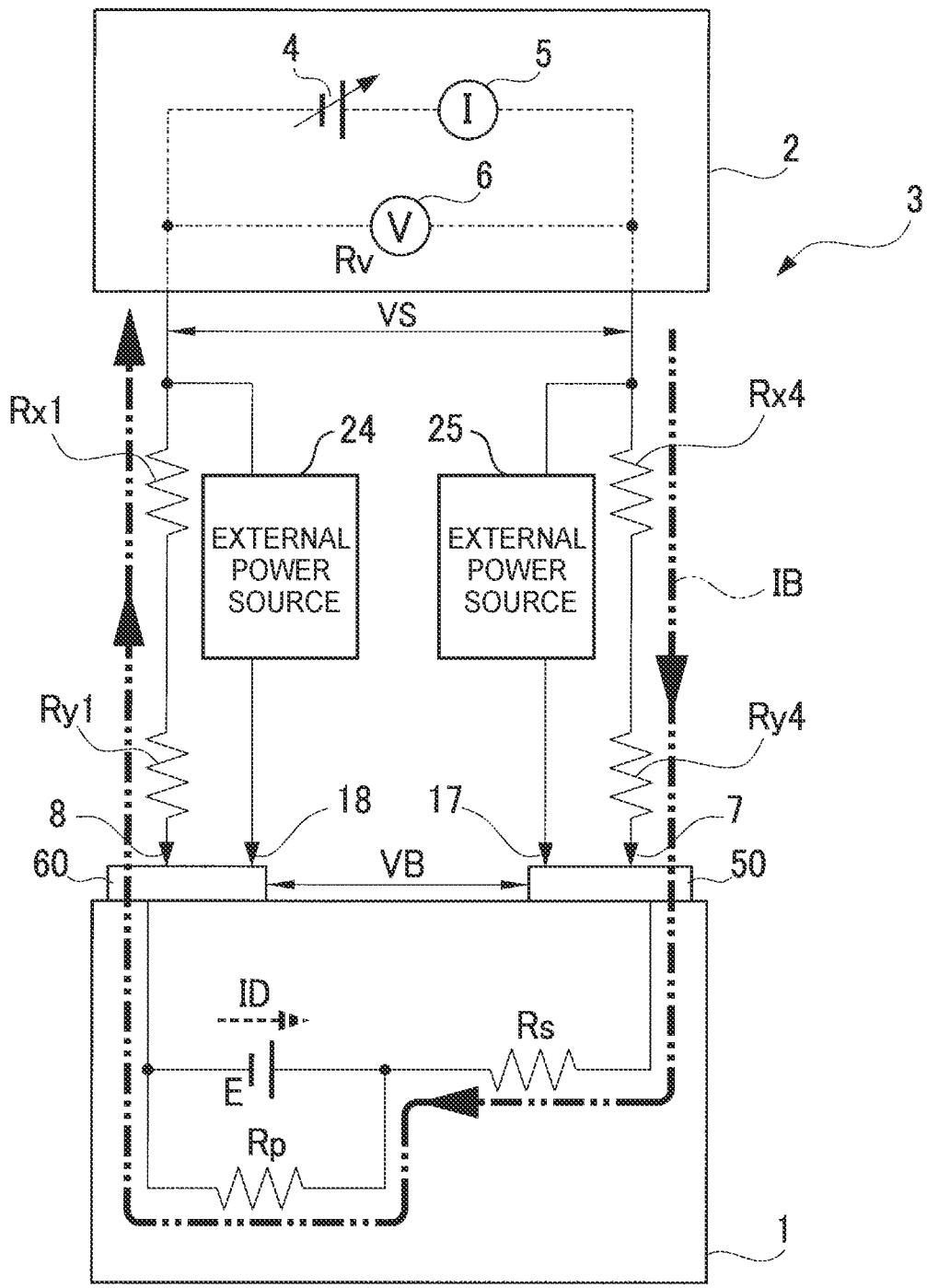
FIG. 11 is a circuit diagram illustrating a fourth modification of actual measurement of the circuit resistance.

A fourth modification is illustrated in FIG. 11. The modification in FIG. 11 is obtained such that the ohmmeters 13, 14 in FIG. 10 are replaced with external power sources 24, 25. Each of the external power sources 24, 25 has a function to apply an extremely low voltage and a function to measure a weak current flowing at this time. Instead of using the ohmmeters 13, 14, a ratio between the applied voltage and the weak current is found. Also in the modification, the circuit resistance Rc is measured such that the probes 7, 8 and the sub-probes 17, 18 are connected to the secondary battery 1. After that, the sub-probes 17, 18 are disconnected from the terminals 50, 60 (or the switches 22, 23 are turned off), and the measurement of the circuit current IB is performed.

In the modifications in FIGS. 8, 9 among the four modifications, the contact resistances Ry4, Ry1 of the probes 7, 8 are not taken into consideration. In this respect, the modifications in FIGS. 8, 9 are slightly disadvantageous as compared with the configuration in FIG. 1 in terms of accuracy. Even so, the measurement of the circuit resistance Rc should be performed, rather than not performed. Further, when the pressing forces of the probes 7, 8 against the terminals 50, 60 are made constant every time, variations of the contact resistances Ry4, Ry1 can be restrained to some extent.

In the modifications in FIGS. 10, 11, at the time of the measurement of the circuit resistance Rc, the circuit resistance Rc is actually affected by the lead-wire resistances Rx3, Rx2 and the contact resistances Ry3, Ry2 of the sub-probes 17, 18. Accordingly, the modifications in FIGS. 10, 11 are also slightly disadvantageous as compared with the configuration in FIG. 1 in terms of accuracy by just that much. Similarly to the above, it is also possible to employ such a technique that the probe 7, 8 and the sub-probe 17, 18 are set so that their resistance values are considered to be the same, and a half of the measured value is set as the circuit resistance Rc.

As described above, with the present embodiment, the measuring device 2 is connected to the secondary battery 1 such that an external voltage is applied in a reverse direction, and quality determination is performed based on a convergence value of the circuit current IBs in that state. Hereby, in comparison with a case where the determination is performed based on a decrease amount of the battery voltage VB, shortening of the necessary time and improvement of determination accuracy are achieved. Further, in the present embodiment, for each of the secondary batteries 1, the circuit resistance Rc of the circuit 3 formed for measurement of the circuit current IB is actually measured. Based on the actual value, time T2 when the circuit current IB converges is predicted. Hereby, the inspection method of the secondary battery that can perform quality determination of the secondary battery 1 quickly and highly accurately by acquiring the circuit current IB s after convergence at an appropriate timing is achieved.

Further, a newly assembled and uncharged secondary battery 1 is subjected to the initial charge to a predetermined charged state, so that a charged secondary battery 1 is formed. Then, the charged secondary battery 1 is inspected by the inspection method. Hereby, a manufacturing method of a secondary battery, having the feature of the inspection method of the secondary battery in the present embodiment, can be achieved. The assembly of the secondary battery 1 is performed such that the electrode laminated body 20 is accommodated in the outer packaging body 10 (see FIG. 2), an electrolytic solution is poured into the outer packaging body 10, and then, the outer packaging body 10 is sealed.

Note that the present embodiment is merely an example and does not limit the disclosure at all. Accordingly, it goes without saying that the disclosure can be altered or modified variously within a range that does not deviate from the gist of the disclosure. For example, the embodiment does not particularly mention pressurization of the target secondary battery 1. However, at the time of high-temperature aging or current measurement, the secondary battery 1 may be pressurized in its thickness direction. Alternatively, several secondary batteries 1 may be laminated in the thickness direction, bundled by a restraint jig at the same time, and then pressurized. Further, in the embodiment, the actual measurement of the circuit resistance Rc is performed based on the reading value of the voltmeter 6 provided inside the measuring device 2. Alternatively, the circuit resistance Rc may be actually measured by use of a voltmeter different from the measuring device 2.

Further, at the time of high-temperature aging or current measurement, the secondary battery 1 or the bundled secondary batteries 1 may be put on an inspection rack. This is because the secondary batteries 1 on the same inspection rack can be considered to have the same temperature history. Further, quality determination of the acquired circuit current IBs after convergence may not be a simple comparison with the reference value IK. Further, the inspection method of the present embodiment is not limited to a secondary battery just manufactured as a new product and can be performed on a used secondary battery for a remanufacturing process of a used assembled battery. Further, an electrical storage device as a determination target is not limited to the secondary battery and may be capacitors such as an electric double layer capacitor and a lithium-ion capacitor.

What is claimed is:

1. An inspection method of an electrical storage device, the inspection method comprising:
    performing current measurement to acquire a current value after convergence of a current flowing through a circuit formed by connecting an external power source to a charged electrical storage device so that a polarity of a voltage of the external power source is reverse to a polarity of a voltage of the charged electrical storage device, the current measurement being performed after the voltage of the external power source is adjusted so that the current does not flow through the circuit right after the connection; and
    performing quality determination to determine quality of the electrical storage device based on the current value after convergence of the current, the current value being acquired by the current measurement, wherein:
    a relationship between a circuit resistance of the circuit and a necessary time for convergence of the current in the current measurement is grasped in advance;
    resistance measurement to actually measure the circuit resistance of the circuit and prediction to predict a convergence timing of the current based on the actually measured circuit resistance and the relationship are performed; and
    in the current measurement, the current value is acquired when the predicted convergence timing comes, and the acquired current value is set as the current value after convergence.

2. The inspection method according to claim 1, wherein:
    the resistance measurement is performed after the electrical storage device is connected to the external power source; and
    the current measurement is then performed without disconnecting the electrical storage device from the external power source in the circuit.

3. The inspection method according to claim 2, wherein the resistance measurement is performed such that:
    the external power source and a first terminal of the electrical storage device are connected by a first probe and a first sub-probe parallel to each other, and a circuit resistance of a first closed circuit constituted by the first probe and the first sub-probe thus parallel to each other is acquired;
    the external power source and a second terminal of the electrical storage device are connected by a second probe and a second sub-probe parallel to each other, and a circuit resistance of a second closed circuit constituted by the second probe and the second sub-probe thus parallel to each other is acquired; and
    a half of a total sum of the acquired circuit resistance of the first closed circuit and the acquired circuit resistance of the second closed circuit is set as the circuit resistance of the circuit.

4. The inspection method according to claim 1, wherein the current measurement is performed such that:
    the resistance measurement and the prediction performed subsequently to the resistance measurement are performed repeatedly so that the predicted convergence timing is updated; and
    the current value is acquired when a latest predicted convergence timing comes.

5. The inspection method according to claim 1, wherein determination on whether the current flowing through the circuit converges or not is performed such that, when a change of the current value of the current flowing through the circuit becomes smaller than a reference set in advance, it is determined that the current converges.

6. The inspection method according to claim 1, wherein the quality determination to determine the quality of the electrical storage device is performed by comparing the current value after convergence of the current flowing through the circuit with a reference value.

7. A manufacturing method of an electrical storage device, the manufacturing method comprising:
    performing initial charge such that an assembled electrical storage device in an uncharged state is charged initially to a predetermined charged state, so that a charged electrical storage device is formed; and
    performing inspection to inspect the charged electrical storage device, wherein the inspection is performed by performing the inspection method according to claim 1.

8. An inspection method of an electrical storage device, the inspection method comprising:
    performing current measurement to acquire a current value after convergence of a current flowing through a circuit formed by connecting an external power source to a charged electrical storage device so that a polarity of a voltage of the external power source is reverse to a polarity of a voltage of the charged electrical storage device, the current measurement being performed after the voltage of the external power source is adjusted so that the current does not flow through the circuit right after the connection; and
    performing quality determination to determine quality of the electrical storage device based on the current value after convergence of the current, the current value being acquired by the current measurement, wherein:
    a relationship between a circuit resistance of the circuit and a necessary time for convergence of the current in the current measurement is grasped in advance;
    in the current measurement, resistance measurement to actually measure the circuit resistance of the circuit and prediction to predict a convergence timing of the current based on the actually measured circuit resistance and the relationship are performed; and
    after that, without disconnecting the electrical storage device from the external power source in the circuit, the current value is acquired when the predicted convergence timing comes, and the acquired current value is set as the current value after convergence.

9. The inspection method according to claim 8, wherein the resistance measurement is performed such that:
    the external power source and a first terminal of the electrical storage device are connected by a first probe and a first sub-probe parallel to each other, and a circuit resistance of a first closed circuit constituted by the first probe and the first sub-probe thus parallel to each other is acquired;
    the external power source and a second terminal of the electrical storage device are connected by a second probe and a second sub-probe parallel to each other, and a circuit resistance of a second closed circuit constituted by the second probe and the second sub-probe thus parallel to each other is acquired; and
    a half of a total sum of the acquired circuit resistance of the first closed circuit and the acquired circuit resistance of the second closed circuit is set as the circuit resistance of the circuit.

10. The inspection method according to claim 8, wherein the current measurement is performed such that:

the resistance measurement and the prediction performed subsequently to the resistance measurement are performed repeatedly so that the predicted convergence timing is updated; and the current value is acquired when a latest predicted convergence timing comes.

11. The inspection method according to claim 8, wherein determination on whether the current flowing through the circuit converges or not is performed such that, when a change of the current value of the current flowing through the circuit becomes smaller than a reference set in advance, it is determined that the current converges.

12. The inspection method according to claim 8, wherein the quality determination to determine the quality of the electrical storage device is performed by comparing the current value after convergence of the current flowing through the circuit with a reference value.

* * * * *